United States Patent
Kaynak et al.

(10) Patent No.: US 12,348,244 B2
(45) Date of Patent: Jul. 1, 2025

(54) DETECTING A STALL CONDITION IN BIT FLIPPING DECODING USING SYNDROME WEIGHT SLOPE

(71) Applicant: Micron Technology, Inc., Boise, ID (US)

(72) Inventors: Mustafa N. Kaynak, San Diego, CA (US); Sivagnanam Parthasarathy, Carlsbad, CA (US)

(73) Assignee: MICRON TECHNOLOGY, INC., Boise, ID (US)

( * ) Notice: Subject to any disclaimer, the term of this patent is extended or adjusted under 35 U.S.C. 154(b) by 0 days.

(21) Appl. No.: 18/438,919

(22) Filed: Feb. 12, 2024

(65) Prior Publication Data

US 2024/0275407 A1    Aug. 15, 2024

Related U.S. Application Data

(60) Provisional application No. 63/484,807, filed on Feb. 14, 2023.

(51) Int. Cl.
  *H03M 13/00*   (2006.01)
  *H03M 13/11*   (2006.01)
  *H03M 13/15*   (2006.01)

(52) U.S. Cl.
  CPC .... *H03M 13/1108* (2013.01); *H03M 13/1128* (2013.01); *H03M 13/1575* (2013.01)

(58) Field of Classification Search
  CPC ......... H03M 13/1108; H03M 13/1128; H03M 13/1575; H03M 13/2948; H03M 13/3753; H03M 13/3746
  See application file for complete search history.

(56) References Cited

U.S. PATENT DOCUMENTS

| | | | |
|---|---|---|---|
| 9,385,753 B2* | 7/2016 | Varnica | H03M 13/1108 |
| 10,135,464 B2* | 11/2018 | Wang | H03M 13/1108 |
| 10,153,786 B1* | 12/2018 | Nguyen | H03M 13/2906 |
| 11,146,290 B1* | 10/2021 | Xiong | H03M 13/1111 |
| 11,469,775 B2* | 10/2022 | Savin | H03M 13/1108 |

\* cited by examiner

*Primary Examiner* — Esaw T Abraham
(74) *Attorney, Agent, or Firm* — NICHOLSON DE VOS WEBSTER & ELLIOTT LLP

(57) ABSTRACT

Methods, systems, and apparatuses detect and mitigate a stall condition in an iterative bit flipping decoder. A codeword is received and one or more of the bits in the codeword are flipped in each of multiple iterations of bit flipping decoding using a first set of bit flipping rules. Each of the iterations includes a determination of a syndrome weight. In response to determining a count of iterations in which the syndrome weight increased satisfies a threshold, one or more of the bits in the codeword are flipped in a subsequent iteration using a second set of bit flipping rules that differs from the first set of bit flipping rules.

20 Claims, 5 Drawing Sheets

| Iteration | Syndrome Weight Start | Syndrome Weight End | Slope |
|---|---|---|---|
| 0 | 604 | 300 | - |
| 1 | 300 | 76 | - |
| 2 | 76 | 46 | - |
| 3 | 46 | 38 | - |
| 4 | 38 | 36 | - |
| 5 | 36 | 34 | - |
| 6 | 34 | 50 | + |
| 7 | 50 | 30 | - |
| 8 | 30 | 30 | 0 |
| 9 | 30 | 28 | - |
| 10 | 28 | 24 | - |
| 11 | 24 | 12 | - |
| 12 | 12 | 12 | 0 |
| 13 | 12 | 16 | + |
| 14 | 16 | 10 | - |
| 15 | 10 | 12 | + |
| 16 | 12 | 12 | 0 |
| 17 | 12 | 16 | + |
| 18 | 16 | 10 | - |
| 19 | 10 | 12 | + |
| 20 | 12 | 6 | - |

STALL PATTERN 202

ERROR CORRECTOR 113

DETECTING A STALL CONDITION IN BIT FLIPPING DECODING USING SYNDROME WEIGHT SLOPE

CROSS-REFERENCE TO RELATED APPLICATION

The present application claims the benefit of U.S. Provisional Patent Application No. 63/484,807 filed on Feb. 14, 2023, which is incorporated by reference herein in its entirety.

TECHNICAL FIELD

The present disclosure generally relates to error correction in memory subsystems, and more specifically, relates to efficiently detecting and mitigating stall conditions in bit flipping decoding.

BACKGROUND ART

A memory subsystem can include one or more memory devices that store data. The memory devices can be, for example, non-volatile memory devices and volatile memory devices. In general, a host system can utilize a memory subsystem to store data at the memory devices and to retrieve data from the memory devices.

BRIEF DESCRIPTION OF THE DRAWINGS

The disclosure will be understood more fully from the detailed description given below and from the accompanying drawings of various embodiments of the disclosure. The drawings, however, should not be taken to limit the disclosure to the specific embodiments, but are for explanation and understanding only.

DETAILED DESCRIPTION

Figure 1:
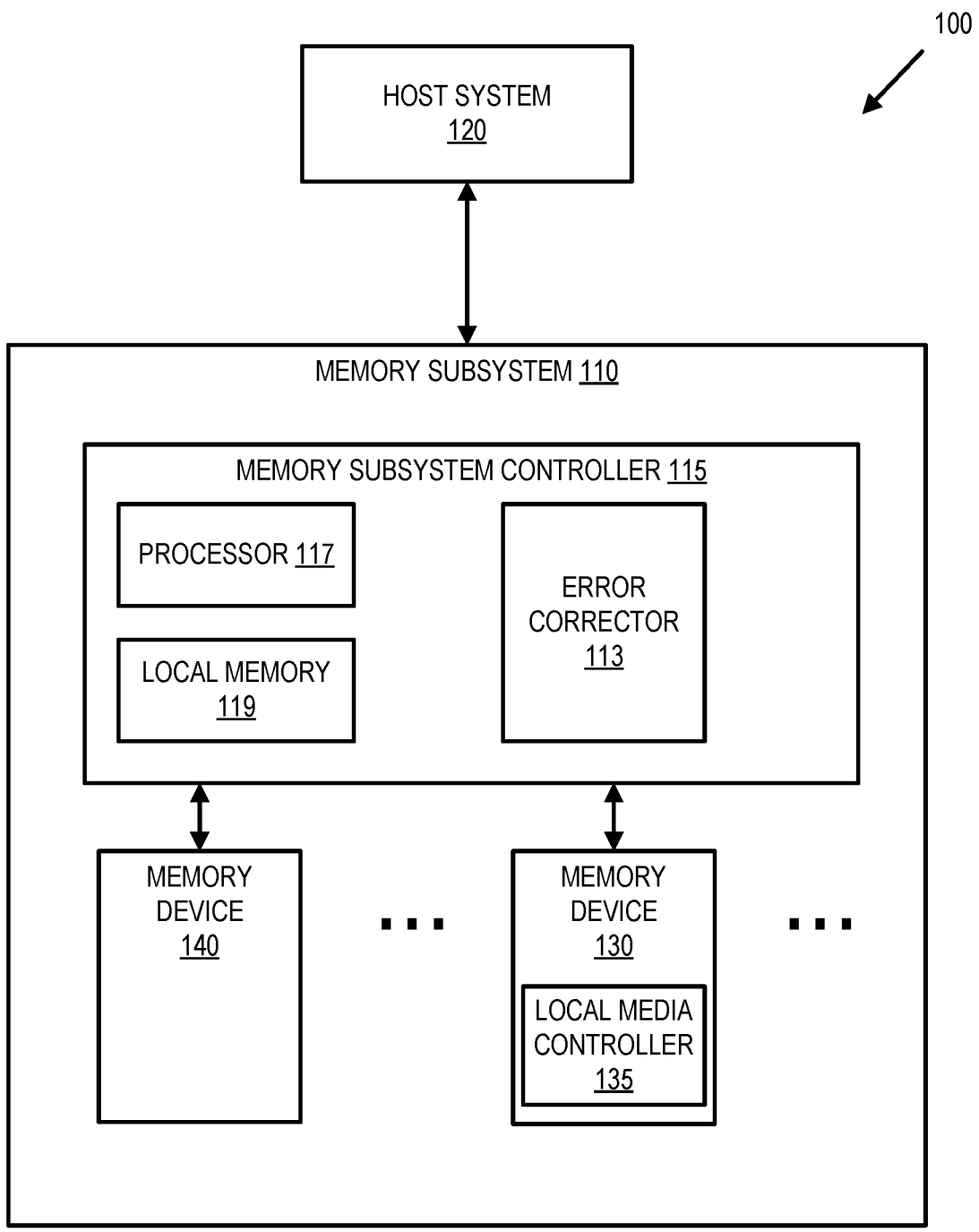
FIG. 1 illustrates an example computing system that includes a memory subsystem in accordance with some embodiments of the present disclosure.

Aspects of the present disclosure are directed to efficiently detecting and mitigating stall conditions in a bit flipping decoding process for a memory subsystem. A memory subsystem can be a storage device, a memory module, or a hybrid of a storage device and memory module. Examples of storage devices and memory modules are described below in conjunction with FIG. 1. In general, a host system can utilize a memory subsystem that includes one or more components, such as memory devices that store data. The host system can provide data to be stored at the memory subsystem and can request data to be retrieved from the memory subsystem.

A memory device can be a non-volatile memory device. A non-volatile memory device is a package of one or more dice. One example of non-volatile memory devices is a negative-and (NAND) memory device. Other examples of non-volatile memory devices are described below in conjunction with FIG. 1. The dice in the packages can be assigned to one or more channels for communicating with a memory subsystem controller. Each die can consist of one or more planes. Planes can be grouped into logic units (LUN). For some types of non-volatile memory devices (e.g., NAND memory devices), each plane consists of a set of physical blocks, which are groups of memory cells to store data. A cell is an electronic circuit that stores information.

Depending on the cell type, a cell can store one or more bits of binary information, and has various logic states that correlate to the number of bits being stored. The logic states can be represented by binary values, such as "0" and "1", or combinations of such values. There are various types of cells, such as single-level cells (SLCs), multi-level cells (MLCs), triple-level cells (TLCs), and quad-level cells (QLCs). For example, an SLC can store one bit of information and has two logic states.

Low-Density Parity Check (LDPC) codes are commonly used for enabling error correction in memory subsystems. LDPC codes are a class of highly efficient linear block codes that include single parity check (SPC) codes. LDPC codes have a high error correction capability and can provide performance close to channel capacity. The MinSum algorithm (MSA), which is a simplified version of a belief propagation algorithm, can be used for decoding LDPC codes. MSA-based decoders, however, use a relatively high amount of energy per bit (e.g., pico-Joule per bit) for decoding codewords. As a result, MSA-based decoders are not well suited for energy conscious applications, such as mobile applications.

A bit flipping (BF) decoder iteratively determines an energy function for each bit in a codeword and flips the bit when the energy function satisfies a bit flipping criterion/threshold. The energy function represents the reliability of the current state of a bit, e.g., in terms of the number of satisfied parities for the bit, the number of unsatisfied parities for the bit, whether the current state of the bit matches the state of the bit when read from memory (channel information), etc. BF decoders use less energy per bit at the expense of providing a lower error correction capability when compared to the error correction capability of MSA-based decoders. Lower error correction capability is an obstacle to the deployment of BF decoders for replacing MSA-based decoders. Additionally, a BF decoder can get stuck in a stall condition, e.g., in which a pattern of the count of unsatisfied parities repeats and additional iterations of the decoder do not enable the BF decoder to further reduce the count of unsatisfied parities and complete the decoding process. Such stall conditions affect the Quality of Service (QoS) and latency of the memory subsystem. A BF decoder unable to exit a stall condition can trigger escalated error handling operations, even when the raw bit error rate (RBER) is low, which results in worse QoS and higher latency.

Aspects of the present disclosure address the above and other deficiencies by detecting and mitigating a stall condition in the BF decoding process. Each of the multiple iterations of bit flipping decoding uses a first set of bit flipping rules and includes a determination of a syndrome weight. In response to determining a count of iterations in which the syndrome weight increased satisfies a iteration count threshold, a second set of bit flipping rules (that differs from the first set of bit flipping rules) is used in one or more subsequent iterations. For example, the count of iterations in which the syndrome weight increased can be tracked in a window/subset of iterations. Tracking increases in syndrome weight provides an efficient way (in terms of processing power and memory used) to detect potential stall conditions. As a result of the change in one or more bit flipping rules, such as the use of channel information, bit flipping order, prevention of a bit flip in back-to-back iterations, and/or bit flipping threshold, the BF decoding increases the likelihood of breaking out of the stall condition and successfully decoding the codeword.

FIG. 1 illustrates an example computing system 100 that includes a memory subsystem 110 in accordance with some embodiments of the present disclosure. The memory subsystem 110 can include media, such as one or more volatile memory devices (e.g., memory device 140), one or more non-volatile memory devices (e.g., memory device 130), or a combination of such.

A memory subsystem 110 can be a storage device, a memory module, or a hybrid of a storage device and memory module. Examples of a storage device include a solid-state drive (SSD), a flash drive, a universal serial bus (USB) flash drive, an embedded Multi-Media Controller (eMMC) drive, a Universal Flash Storage (UFS) drive, a secure digital (SD) card, and a hard disk drive (HDD). Examples of memory modules include a dual in-line memory module (DIMM), a small outline DIMM (SO-DIMM), and various types of non-volatile dual in-line memory module (NVDIMM).

The computing system 100 can be a computing device such as a desktop computer, laptop computer, network server, mobile device, a vehicle (e.g., airplane, drone, train, automobile, or other conveyance), Internet of Things (IoT) enabled device, embedded computer (e.g., one included in a vehicle, industrial equipment, or a networked commercial device), or such computing device that includes memory and a processing device.

The computing system 100 can include a host system 120 that is coupled to one or more memory subsystems 110. In some embodiments, the host system 120 is coupled to different types of memory subsystems 110. FIG. 1 illustrates one example of a host system 120 coupled to one memory subsystem 110. As used herein, "coupled to" or "coupled with" generally refers to a connection between components, which can be an indirect communicative connection or direct communicative connection (e.g., without intervening components), whether wired or wireless, including connections such as electrical, optical, magnetic, etc.

The host system 120 can include a processor chipset and a software stack executed by the processor chipset. The processor chipset can include one or more cores, one or more caches, a memory controller (e.g., NVDIMM controller), and a storage protocol controller (e.g., PCIe controller, SATA controller). The host system 120 uses the memory subsystem 110, for example, to write data to the memory subsystem 110 and read data from the memory subsystem 110.

The host system 120 can be coupled to the memory subsystem 110 via a physical host interface. Examples of a physical host interface include, but are not limited to, a serial advanced technology attachment (SATA) interface, a peripheral component interconnect express (PCIe) interface, universal serial bus (USB) interface, Fibre Channel, Serial Attached SCSI (SAS), Small Computer System Interface (SCSI), a double data rate (DDR) memory bus, a dual in-line memory module (DIMM) interface (e.g., DIMM socket interface that supports Double Data Rate (DDR)), Open NAND Flash Interface (ONFI), Double Data Rate (DDR), Low Power Double Data Rate (LPDDR), or any other interface. The physical host interface can be used to transmit data between the host system 120 and the memory subsystem 110. The host system 120 can further utilize an NVM Express (NVMe) interface to access components (e.g., memory devices 130) when the memory subsystem 110 is coupled with the host system 120 by the PCIe interface. The physical host interface can provide an interface for passing control, address, data, and other signals between the memory subsystem 110 and the host system 120. FIG. 1 illustrates a memory subsystem 110 as an example. In general, the host system 120 can access multiple memory subsystems via a same communication connection, multiple separate communication connections, and/or a combination of communication connections.

The memory devices 130,140 can include any combination of the different types of non-volatile memory devices and/or volatile memory devices. The volatile memory devices (e.g., memory device 140) can be, but are not limited to, random access memory (RAM), such as dynamic random access memory (DRAM) and synchronous dynamic random access memory (SDRAM).

Some examples of non-volatile memory devices (e.g., memory device 130) include negative-and (NAND) type flash memory and write-in-place memory, such as a three-dimensional cross-point ("3D cross-point") memory device, which is a cross-point array of non-volatile memory cells. A cross-point array of non-volatile memory can perform bit storage based on a change of bulk resistance, in conjunction with a stackable cross-gridded data access array. Additionally, in contrast to many flash-based memories, cross-point non-volatile memory can perform a write in-place operation, where a non-volatile memory cell can be programmed without the non-volatile memory cell being previously erased. NAND type flash memory includes, for example, two-dimensional NAND (2D NAND) and three-dimensional NAND (3D NAND).

Although non-volatile memory devices such as NAND type memory (e.g., 2D NAND, 3D NAND) and 3D cross-point array of non-volatile memory cells are described, the memory device 130 can be based on any other type of non-volatile memory, such as read-only memory (ROM), phase change memory (PCM), self-selecting memory, other chalcogenide based memories, ferroelectric transistor random-access memory (FeTRAM), ferroelectric random access memory (FeRAM), magneto random access memory (MRAM), Spin Transfer Torque (STT)-MRAM, conductive bridging RAM (CBRAM), resistive random access memory (RRAM), oxide based RRAM (OxRAM), negative-or (NOR) flash memory, and electrically erasable programmable read-only memory (EEPROM).

A memory subsystem controller 115 (or controller 115 for simplicity) can communicate with the memory devices 130 to perform operations such as reading data, writing data, or erasing data at the memory devices 130 and other such operations (e.g., in response to commands scheduled on a command bus by controller 115). The memory subsystem controller 115 can include hardware such as one or more integrated circuits and/or discrete components, a buffer memory, or a combination thereof. The hardware can include digital circuitry with dedicated (i.e., hard-coded) logic to perform the operations described herein. The memory subsystem controller 115 can be a microcontroller, special purpose logic circuitry (e.g., a field programmable gate array (FPGA), an application specific integrated circuit (ASIC), etc.), or another suitable processor.

The memory subsystem controller 115 can include a processing device 117 (processor) configured to execute instructions stored in a local memory 119. In the illustrated example, the local memory 119 of the memory subsystem controller 115 includes an embedded memory configured to store instructions for performing various processes, operations, logic flows, and routines that control operation of the memory subsystem 110, including handling communications between the memory subsystem 110 and the host system 120.

In some embodiments, the local memory 119 can include memory registers storing memory pointers, fetched data, etc. The local memory 119 can also include read-only memory (ROM) for storing micro-code. While the example memory subsystem 110 in FIG. 1 has been illustrated as including the memory subsystem controller 115, in another embodiment of the present disclosure, a memory subsystem 110 does not include a memory subsystem controller 115, and can instead rely upon external control (e.g., provided by an external host, or by a processor or controller separate from the memory subsystem 110).

In general, the memory subsystem controller 115 can receive commands or operations from the host system 120 and can convert the commands or operations into instructions or appropriate commands to achieve the desired access to the memory devices 130 and/or the memory device 140. The memory subsystem controller 115 can be responsible for other operations such as wear leveling operations, garbage collection operations, error detection and error-correcting code (ECC) operations, encryption operations, caching operations, and address translations between a logical address (e.g., logical block address (LBA), namespace) and a physical address (e.g., physical block address) that are associated with the memory devices 130. The memory subsystem controller 115 can further include host interface circuitry to communicate with the host system 120 via the physical host interface. The host interface circuitry can convert the commands received from the host system into command instructions to access the memory devices 130 and/or the memory device 140 as well as convert responses associated with the memory devices 130 and/or the memory device 140 into information for the host system 120.

The memory subsystem 110 can also include additional circuitry or components that are not illustrated. In some embodiments, the memory subsystem 110 can include a cache or buffer (e.g., DRAM) and address circuitry (e.g., a row decoder and a column decoder) that can receive an address from the memory subsystem controller 115 and decode the address to access the memory devices 130.

In some embodiments, the memory devices 130 include local media controllers 135 that operate in conjunction with memory subsystem controller 115 to execute operations on one or more memory cells of the memory devices 130. An external controller (e.g., memory subsystem controller 115) can externally manage the memory device 130 (e.g., perform media management operations on the memory device 130). In some embodiments, a memory device 130 is a managed memory device, which is a raw memory device combined with a local controller (e.g., local controller 135) for media management within the same memory device package. An example of a managed memory device is a managed NAND (MNAND) device.

The memory subsystem 110 includes error corrector 113 that detects and mitigates stall conditions. In some embodiments, the controller 115 includes at least a portion of the error corrector 113. For example, the controller 115 can include a processor 117 (processing device) configured to execute instructions stored in local memory 119 for performing the operations described herein. In some embodiments, an error corrector 113 is part of the host system 120, an application, or an operating system.

In some implementations, the error corrector 113 encodes and decodes data stored in the memory device (e.g., an encoder and/or decoder). Encoding data using an error correcting code (ECC) allows for correction of erroneous data bits when the data is retrieved from the memory device. For example, the error corrector 113 can encode data received from the host system 120, generating parity bits using different combinations of the data received from the host, and store the data and parity bits as codewords in the memory device 130. The error corrector 113 decodes data stored in the memory device 130 to identify and correct erroneous bits of the data before transmitting corrected data to the host system 120. Although illustrated as a single component that can perform encoding and decoding of data, the error corrector 113 can be provided as separate components. In some embodiments, the error corrector 113 encodes data according to a low-density parity-check (LDPC) code. The error corrector 113 decodes the codewords stored in the memory device 130 based on a BF decoder. As described below, the error corrector 113 detects a potential stall condition using syndrome weight slope (e.g., increase in syndrome weight after an iteration). In response to detecting a potential stall condition, the memory subsystem takes a remediation action, such as modifying a set of bit flipping rules for the BF decoder. For example, by preventing the flipping of the same bit in back-to-back iterations, modifying the use of channel information in determining a bit's energy function, modifying an order the plurality of bits of the codeword are iteratively evaluated for flipping, and/or modifying the bit flipping threshold, the memory subsystem improves the decoder's ability to exit a stall condition and, accordingly, the performance of the memory subsystem. Further details with regard to the operations of the error corrector 113 are described below.

Figure 2:
FIG. 2 illustrates a block diagram of an exemplary table including a stall pattern that is detected during error correction of a codeword in accordance with some embodiments.

FIG. 2 illustrates a block diagram of an exemplary table 200 including a stall pattern that is detected during error correction of a codeword, in accordance with some embodiments. The error corrector 113 decodes a codeword, attempting to correct errors for multiple iterations. As an example, the table 200 shows syndrome weights at the start and end of iterations of bit flipping decoding by the error corrector 113. In one embodiment, a syndrome weight indicates a number of parity violations in a codeword. At the initial iteration, 0, the syndrome weight at the start of the iteration is 604 and, following the flipping of multiple bits, the syndrome weight at the end of the iteration is 300. The error corrector 113 performs a subsequent error correction iteration, iteration 1. At iteration 1, the starting syndrome weight is 300 and the ending syndrome weight is 76. These decreases in syndrome weight are indications of progress in reducing the number of parity violations and, as a result, decoding of the codeword.

In one embodiment, the error corrector 113 stores two or more syndrome weights in memory. For example, the error corrector 113 can add the syndrome weight from the end of each iteration to a syndrome weight list or similar data structure. In some embodiments, the syndrome weight list is a first-in, first-out (FIFO) list with a length of two. As such, the syndrome weight list stores the syndrome weight at the start of an iteration and the syndrome weight at the end of an iteration for a given iteration. In other embodiments, the syndrome weight list stores more than two syndrome weights.

The table 200 further illustrates indications of syndrome weight slope. Syndrome weight slope refers to whether the syndrome weight decreased from the start to the end of the iteration (i.e., a negative slope), did not change (i.e., a null slope), or increased from the start to the end of the iteration (i.e., a positive slope). Iterations 0-5 provide examples of negative slope, iteration 8 provides an example of null slope, and iteration 6 provides an example of positive slope. As described herein, the error corrector 113 determines a syndrome weight slope for iterations of bit flipping decoding and detects a potential stall condition when a count of iterations with a positive slope satisfies (e.g., reaches or exceeds) a positive slope/syndrome weight increase count threshold.

In one embodiment, the error corrector 113 stores an indication syndrome weight slope as a binary value (i.e., one of two different values) in a syndrome slope memory. The first value represents a negative or null slope (i.e., not positive slope) and the second value represents a positive slope. By saving one of these two values per iteration in a list or other data structure, the error corrector 113 can track a number of iterations within a subset of all iterations (i.e., a window of iterations) and determine a count of iterations in the window that resulted in a positive slope. For example, the error corrector 113 can save syndrome weight slope indications to a FIFO list with a length equal to the window size. In other embodiments, the window of iterations is defined by the syndrome weight list and the error corrector 113 determines a count of iterations with a positive slope from a current state of the syndrome weight list rather than storing indications of syndrome weight slope. In yet another embodiment, the error corrector 113 can track the number of iterations with a positive slope with a counter (e.g., incrementing a count for each iteration with a positive slope, tracking positive slope across all iterations).

In the example illustrated by the table 200, the BF decoding process of the error corrector 113 starts oscillating (i.e., enters a stall condition) at iteration 12 and the period of oscillation is 4. The stall pattern 202 is repeated a second time (from iteration 16 to iteration 19). Upon detecting a potential stall condition (e.g., the count of iterations with positive slope exceeding a threshold count of 3 within a window of eight iterations), the error corrector 113 updates one or more bit flipping rules. As a result of the change in one or more bit flipping rules, in the example in the table 200, the error corrector 113 breaks out of the stall condition at the end of iteration 20. The detection of a stall condition and resulting update to the bit flipping rule(s) are described in further detail below.

Figure 3:
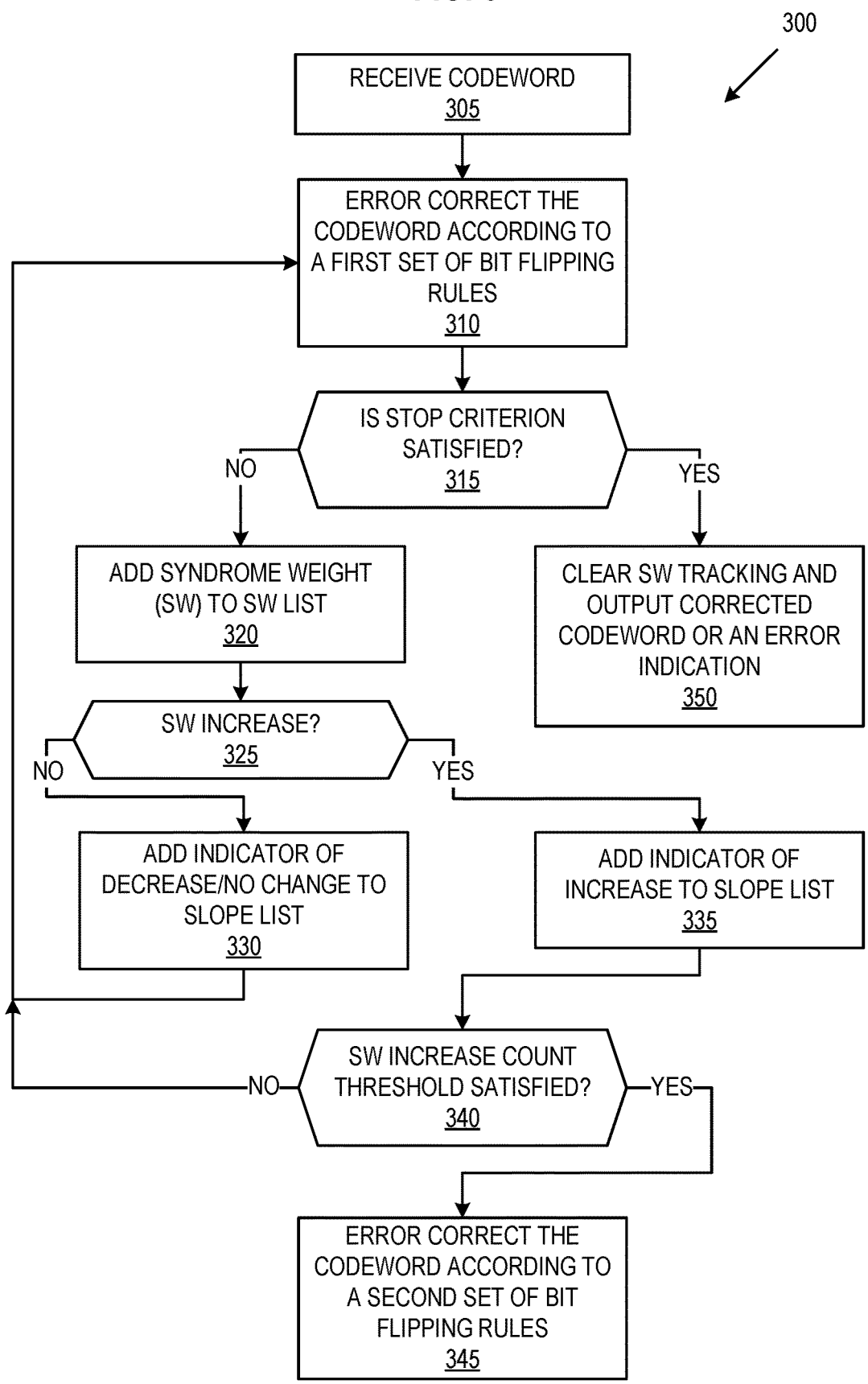
FIG. 3 is a flow diagram of an example method to detect and mitigate a stall condition in iterative decoders in accordance with some embodiments of the present disclosure.

FIG. 3 is a flow diagram of an example method 300 to detect and mitigate a stall condition in a decoder of a memory subsystem in accordance with some embodiments of the present disclosure. The method 300 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 300 is performed by the error corrector 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible. The operations of the method 300 are described with reference to FIG. 2. The illustrated embodiments should be understood only as simple examples, other syndrome weights and stall patterns can occur.

At operation 305, the processing device receives a codeword from a memory device, e.g., memory device 130 or memory device 140. In some embodiments, the codeword is received as a result of the execution of a read request from a host system 120. The codeword includes a combination of data bits and parity check bits. For example, the parity check bits are stored in the memory device along with the data bits.

At operation 310, the processing device iteratively decodes the codeword. For example, the error corrector 113 includes or uses a bit flipping decoder that performs an iteration of the decoding process, flipping bits within the codeword based on an initial set of bit flipping rules. The initial bit flipping rules can include, e.g., a bit flipping criterion/threshold, an order bits are evaluated for flipping, etc. The processing device performs an initial error correction iteration on the codeword to obtain an initial corrected codeword. During an iteration, the processing device determines locations of potentially erroneous bits in the codeword and flips one or more of these bits to obtain an updated codeword (e.g., using an energy function and bit flipping criterion, as described above). The error corrector 113 determines a syndrome weight at the end of each iteration (e.g., the ending syndrome weight described with reference to the table 200).

At operation 315, the processing device determines whether a stop condition/criterion is satisfied. A stop criterion can include an indication that no errors are detected for the codeword. In some embodiments, the stop criterion can include a null syndrome (e.g., syndrome weight of zero) indicating that the codeword no longer include erroneous bits. In some embodiments, the stop criterion can include a maximum number of iterations (i.e., the maximum iteration count) or a maximum amount of time. For example, the processing device is operative to perform the maximum number of iterations (e.g., 30 iterations, 40 iterations, 100 iterations, etc.), and when this number of iterations is performed, the resulting codeword is output, regardless of whether the codeword still includes erroneous bits or not. When the stop criterion is satisfied, the error corrector 113 outputs the corrected codeword or an indication of failure if the processing device was unable to decode the codeword. For example, the error corrector 113 can transmit the corrected codeword to the host 120. In another example, an indication of failure can trigger a different error correction process or the transmission of an error message to the host 120. When the stop criterion is not satisfied, the method 300 proceeds to operation 320. When the stop criterion is satisfied, the method 300 proceeds to operation 350.

At operation 320, the processing device adds the ending syndrome weight to a syndrome weight list or similar data structure. For example, as described above, the error corrector 113 can save the ending syndrome weight value to a FIFO list with a length of two or more. By having both starting and ending syndrome weight values in a given iteration, the error corrector 113 is able to determine syndrome weight slope.

At operation 325, the processing device determines if the syndrome weight increased in the current iteration. For example, the error corrector 113 compares a starting syndrome weight (the ending syndrome weight from the previous iteration) and the ending syndrome weight from the current iteration. In one embodiment, these are the two most recent values in the syndrome weight list. Using this comparison, the error corrector 113 determines if the flipping of one or more bits in the current iteration resulted in more unsatisfied parities in the present iteration than in the previous iteration (i.e., a positive syndrome weight slope). If the syndrome weight did not increase, the method 300 proceeds to operation 330. If the syndrome weight increased, the method 300 proceeds to operation 335.

At operation 330, in response to the syndrome weight not increasing, the processing device adds an indication of a negative or null syndrome weight slope to the syndrome weight slope list. For example, as described above, the error corrector 113 can store an indication syndrome weight slope as a binary value in a list or other data structure to track a subset of all iterations (i.e., a window of iterations) to determine a count of iterations in the window that resulted in a positive slope. The method 300 returns to operation 310 to proceed with the next iteration.

At operation 335, in response to the syndrome weight increasing, the processing device adds an indication of a positive syndrome weight slope to the syndrome weight slope list. Given that the syndrome weight increased, the method 300 proceeds to operation 340 to check the syndrome weight increase count against a threshold.

At operation 340, the processing device determines if the count of iterations with an increase in syndrome weight (positive slope) satisfies a syndrome weight increase count threshold. For example, the error corrector 113 determines the count of indicators of positive syndrome weight slope in the syndrome weight slope list meets or exceeds a threshold value. As described above, the count can be limited to a window of iterations defined by length of the syndrome weight slope list. In other embodiments, the error corrector 113 determines the count by comparing values in the syndrome weight list or by reading a current value of a syndrome weight increase counter. If the count of iterations with a positive syndrome weight slope satisfies a syndrome weight increase count threshold, the method 300 proceeds to operation 345. If the count does not satisfy the threshold, the method 300 returns to operation 310 to proceed with the next iteration.

At operation 345, the processing device performs a remediation action to break out of a stall condition. For example, the error corrector 113 modifies one or more bit flipping rules for the next iteration. As described above, the modified bit flipping rule(s) can include a modified bit flipping threshold, change in the use of channel information (whether it is used or updating an amount it impacts syndrome weight), change in an order in which bits are flipped, begin preventing the flipping of the same bit(s) in back-to-back iterations, etc. In one embodiment, the method 300 continues at operation 310 with the updated set of bit flipping rules and determines if the bit flipping rules should be modified again. In another embodiment, the error corrector 113 performs a number of iterations with the updated set of bit flipping rules and, if a stop criterion is not yet satisfied, resumes iterating with the previous set of bit flipping rules (e.g., returning to operation 310). In yet another embodiment, the error corrector 113 iterates in the bit flipping decoding process with the updated set of bit flipping rules until the stop criterion is satisfied.

At operation 350, in response to determining the stop criterion is satisfied, the processing device outputs the corrected codeword or an indication of failure if the processing device was unable to decode the codeword. For example, the error corrector 113 can transmit the corrected codeword to the host 120. In another example, an indication of failure can trigger a different error correction process or the transmission of an error message to the host 120.

Figure 4:
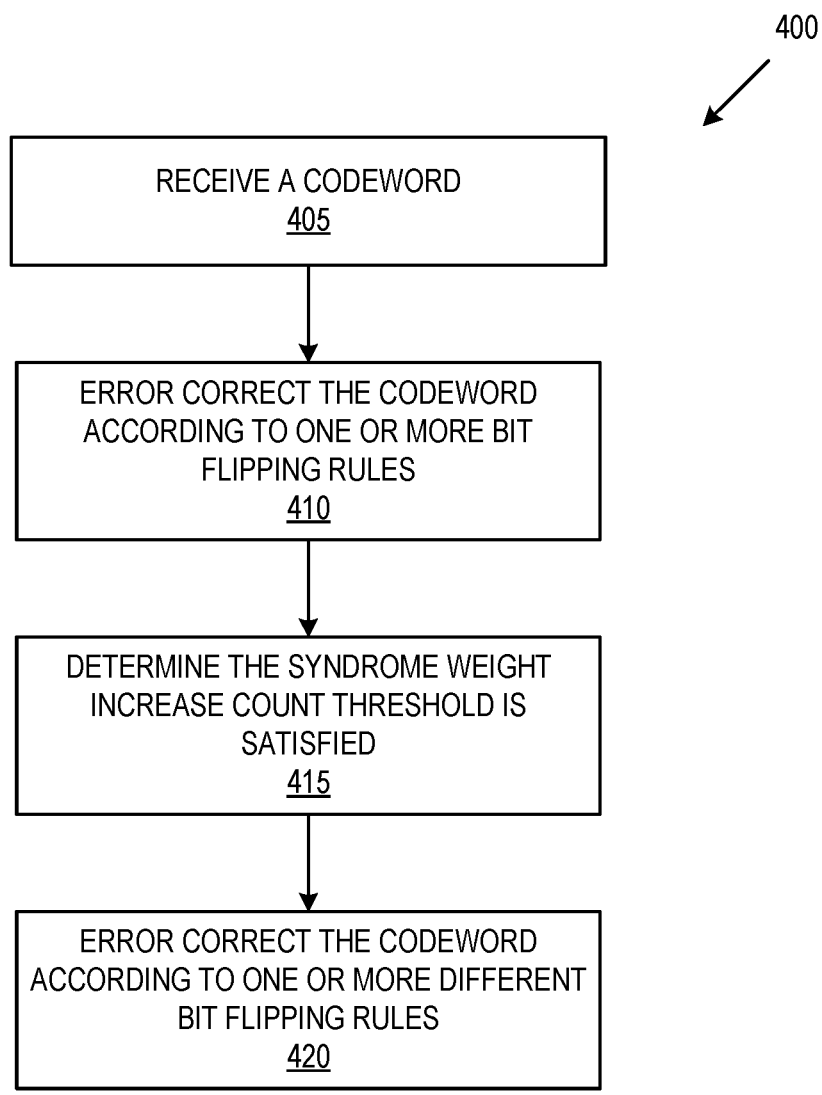
FIG. 4 is a flow diagram of another example method to detect and mitigate a stall condition in iterative decoders in accordance with some embodiments of the present disclosure.

FIG. 4 is a flow diagram of another example method 400 to detect and mitigate a stall condition in a decoder of a memory subsystem in accordance with some embodiments of the present disclosure. The method 400 can be performed by processing logic that can include hardware (e.g., processing device, circuitry, dedicated logic, programmable logic, microcode, hardware of a device, integrated circuit, etc.), software (e.g., instructions run or executed on a processing device), or a combination thereof. In some embodiments, the method 400 is performed by the error corrector 113 of FIG. 1. Although shown in a particular sequence or order, unless otherwise specified, the order of the processes can be modified. Thus, the illustrated embodiments should be understood only as examples, and the illustrated processes can be performed in a different order, and some processes can be performed in parallel. Additionally, one or more processes can be omitted in various embodiments. Thus, not all processes are required in every embodiment. Other process flows are possible.

At operation 405, the processing device receives a codeword from the memory device. For example, the error corrector 113 receives the codeword as a result of the execution of a read request from a host system 120 as described above with reference to operation 305.

At operation 410, the processing device performs error correction on the codeword using one or more bit flipping rules for multiple iterations. For example, the error corrector 113 iteratively decodes the codeword as described above with reference to operation 310.

At operation 415, the processing device determines that a count of iterations in which the syndrome weight (or number of unsatisfied parities) increased satisfies a syndrome weight increase count threshold. For example, the error corrector 113 determines the count of iterations with a positive syndrome weight slope satisfies the syndrome weight increase count threshold as described above with reference to operations 320-340.

At operation 420, the processing device performs at least one iteration of error correction on the codeword using one or more different bit flipping rules. For example, the error corrector 113 modifies one or more bit flipping rules as described above with reference to operation 345.

Figure 5:
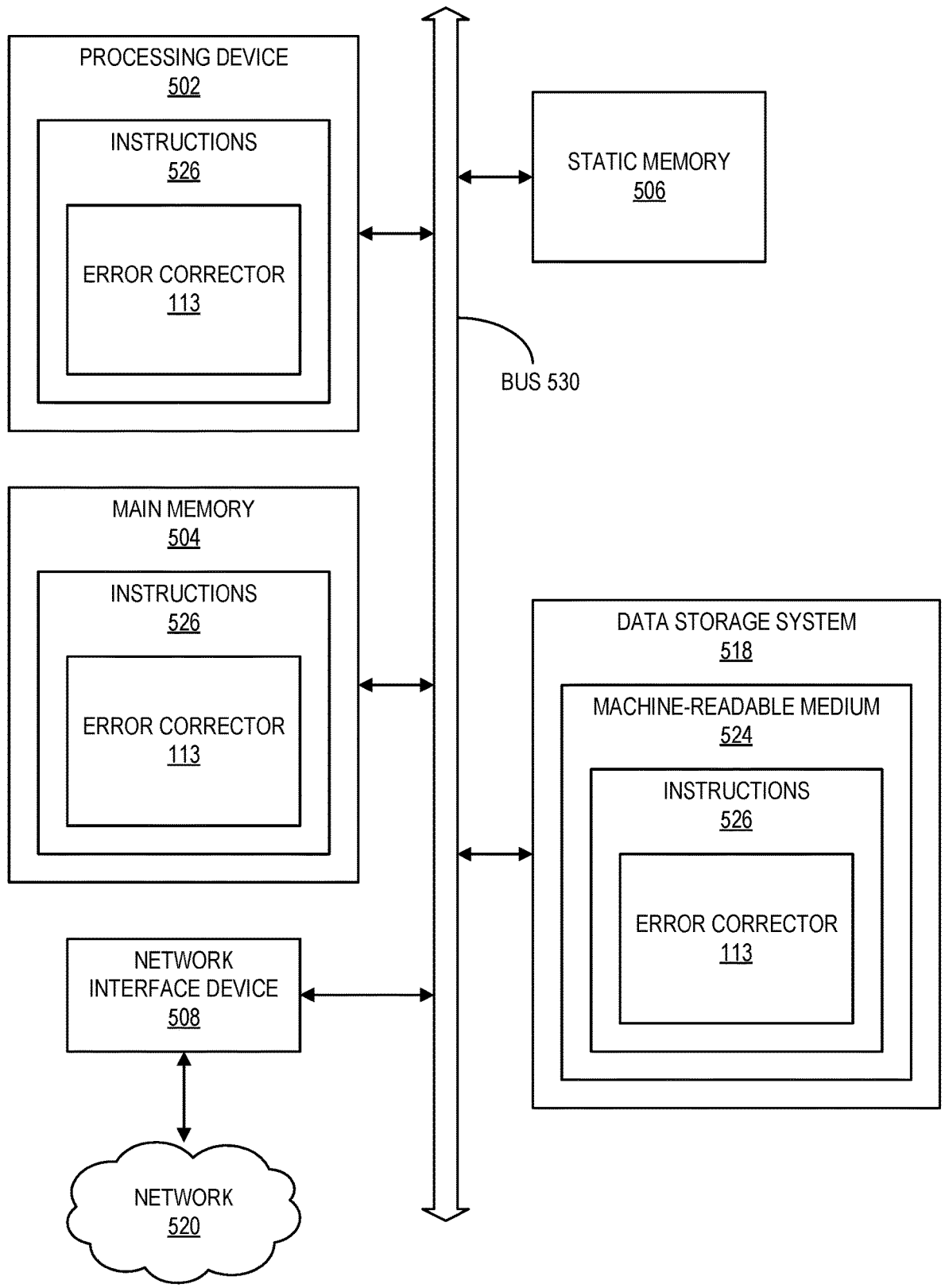
FIG. 5 is a block diagram of an example computer system in which embodiments of the present disclosure can operate.

FIG. 5 illustrates an example machine of a computer system 500 within which a set of instructions for causing the machine to perform any one or more of the methodologies discussed herein, can be executed. In some embodiments, the computer system 500 can correspond to a host system (e.g., the host system 120 of FIG. 1) that includes, is coupled to, or utilizes a memory subsystem (e.g., the memory subsystem 110 of FIG. 1) or can be used to perform the operations of a controller (e.g., to execute an operating system to perform operations corresponding to the error corrector 113 of FIG. 1). In alternative embodiments, the machine can be connected (e.g., networked) to other machines in a LAN, an intranet, an extranet, and/or the Internet. The machine can operate in the capacity of a server or a client machine in client-server network environment, as a peer machine in a peer-to-peer (or distributed) network environment, or as a server or a client machine in a cloud computing infrastructure or environment.

The machine can be a personal computer (PC), a tablet PC, a set-top box (STB), a Personal Digital Assistant (PDA), a cellular telephone, a web appliance, a server, a network router, a switch or bridge, or any machine capable of executing a set of instructions (sequential or otherwise) that specify actions to be taken by that machine. Further, while a single machine is illustrated, the term "machine" shall also be taken to include any collection of machines that individually or jointly execute a set (or multiple sets) of instructions to perform any one or more of the methodologies discussed herein.

The example computer system 500 includes a processing device 502, a main memory 504 (e.g., read-only memory (ROM), flash memory, dynamic random access memory (DRAM) such as synchronous DRAM (SDRAM) or Rambus DRAM (RDRAM), etc.), a static memory 506 (e.g., flash memory, static random access memory (SRAM), etc.), and a data storage system 518, which communicate with each other via a bus 530.

Processing device 502 represents one or more general-purpose processing devices such as a microprocessor, a central processing unit, or the like. More particularly, the processing device can be a complex instruction set computing (CISC) microprocessor, reduced instruction set computing (RISC) microprocessor, very long instruction word (VLIW) microprocessor, or a processor implementing other instruction sets, or processors implementing a combination of instruction sets. Processing device 502 can also be one or more special-purpose processing devices such as an application specific integrated circuit (ASIC), a field programmable gate array (FPGA), a digital signal processor (DSP), network processor, or the like. The processing device 502 is configured to execute instructions 526 for performing the operations and steps discussed herein. The computer system 500 can further include a network interface device 508 to communicate over the network 520.

The data storage system 518 can include a machine-readable storage medium 524 (also known as a computer-readable medium) on which is stored one or more sets of instructions 526 or software embodying any one or more of the methodologies or functions described herein. The instructions 526 can also reside, completely or at least partially, within the main memory 504 and/or within the processing device 502 during execution thereof by the computer system 500, the main memory 504 and the processing device 502 also constituting machine-readable storage media. The machine-readable storage medium 524, data storage system 518, and/or main memory 504 can correspond to the memory subsystem 110 of FIG. 1.

In one embodiment, the instructions 526 include instructions to implement functionality corresponding to an error corrector (e.g., the error corrector 113 of FIG. 1). While the machine-readable storage medium 524 is shown in an example embodiment to be a single medium, the term "machine-readable storage medium" should be taken to include a single medium or multiple media that store the one or more sets of instructions. The term "machine-readable storage medium" shall also be taken to include any medium that is capable of storing or encoding a set of instructions for execution by the machine and that cause the machine to perform any one or more of the methodologies of the present disclosure. The term "machine-readable storage medium" shall accordingly be taken to include, but not be limited to, solid-state memories, optical media, and magnetic media.

Some portions of the preceding detailed descriptions have been presented in terms of algorithms and symbolic representations of operations on data bits within a computer memory. These algorithmic descriptions and representations are the ways used by those skilled in the data processing arts to most effectively convey the substance of their work to others skilled in the art. An algorithm is here, and generally, conceived to be a self-consistent sequence of operations leading to a desired result. The operations are those requiring physical manipulations of physical quantities. Usually, though not necessarily, these quantities take the form of electrical or magnetic signals capable of being stored, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. The present disclosure can refer to the action and processes of a computer system, or similar electronic computing device, that manipulates and transforms data represented as physical (electronic) quantities within the computer system's registers and memories into other data similarly represented as physical quantities within the computer system memories or registers or other such information storage systems.

The present disclosure also relates to an apparatus for performing the operations herein. This apparatus can be specially constructed for the intended purposes, or it can include a general-purpose computer selectively activated or reconfigured by a computer program stored in the computer. For example, a computer system or other data processing system, such as the controller 115, can carry out the computer-implemented methods 300 and 400 in response to its processor executing a computer program (e.g., a sequence of instructions) contained in a memory or other non-transitory machine-readable storage medium. Such a computer program can be stored in a computer readable storage medium, such as, but not limited to, any type of disk including floppy disks, optical disks, CD-ROMs, and magnetic-optical disks, read-only memories (ROMs), random access memories (RAMs), EPROMs, EEPROMs, magnetic or optical cards, or any type of media suitable for storing electronic instructions, each coupled to a computer system bus.

The algorithms and displays presented herein are not inherently related to any particular computer or other apparatus. Various general-purpose systems can be used with programs in accordance with the teachings herein, or it can prove convenient to construct a more specialized apparatus to perform the method. The structure for a variety of these systems will appear as set forth in the description below. In addition, the present disclosure is not described with reference to any particular programming language. It will be appreciated that a variety of programming languages can be used to implement the teachings of the disclosure as described herein.

The present disclosure can be provided as a computer program product, or software, that can include a machine-readable medium having stored thereon instructions, which can be used to program a computer system (or other electronic devices) to perform a process according to the present disclosure. A machine-readable medium includes any mechanism for storing information in a form readable by a machine (e.g., a computer). In some embodiments, a machine-readable (e.g., computer-readable) medium includes a machine (e.g., a computer) readable storage medium such as a read only memory ("ROM"), random access memory ("RAM"), magnetic disk storage media, optical storage media, flash memory components, etc.

In the foregoing specification, embodiments of the disclosure have been described with reference to specific example embodiments thereof. It will be evident that various modifications can be made thereto without departing from the broader spirit and scope of embodiments of the disclosure as set forth in the following claims. The specification and drawings are, accordingly, to be regarded in an illustrative sense rather than a restrictive sense.

What is claimed is:

1. A method comprising:
   receiving a codeword from a memory device, the codeword including a plurality of bits;
   flipping one or more of the plurality of bits in the codeword in each of a plurality of iterations of bit flipping decoding using a first set of one or more bit flipping rules, wherein each of the plurality of iterations includes a determination of a syndrome weight;
   determining a count of iterations in which the syndrome weight increased satisfies a syndrome weight increase count threshold; and
   in response to determining the count of iterations satisfies the syndrome weight increase count threshold, flipping one or more of the plurality of bits in the codeword a subsequent iteration of bit flipping decoding using a second set of one or more bit flipping rules, wherein the second set of bit flipping rules differs from the first set of bit flipping rules.

2. The method of claim 1, the plurality of iterations further comprising:
   adding the syndrome weight to a list of syndrome weights.

3. The method of claim 1, further comprising:
   determining the syndrome weight of a current iteration represents an increase in syndrome weight from a previous iteration; and
   adding an indication of the increase in syndrome weight to a syndrome slope memory.

4. The method of claim 3, wherein the syndrome slope memory is a first-in, first-out (FIFO) list of indications of syndrome weight slope between subsequent iterations, and wherein determining the count of iterations in which the syndrome weight increased is limited to a window of iterations defined by a length of the FIFO list.

5. The method of claim 1, further comprising:
   determining the syndrome weight of a current iteration represents a decrease in syndrome weight from a previous iteration; and
   adding an indication of the decrease in syndrome weight to a syndrome slope memory.

6. The method of claim 1, wherein the second set of bit flipping rules differs from the first set of bit flipping rules in one or more of:
   use of channel information;
   an order the bit flipping decoder evaluates the plurality of bits of the codeword for flipping; and
   a bit flipping threshold, wherein the bit flipping threshold is compared against an energy function of each of the plurality of bits of the codeword in determining which bits to flip.

7. The method of claim 1, wherein the first set of bit flipping rules allows a bit to be flipped in back-to-back iterations and the second set of bit flipping rules prevents a bit from being flipped in back-to-back iterations.

8. A non-transitory computer-readable storage medium comprising instructions that, when executed by a processing device, cause the processing device to:
   receive a codeword from a memory device, the codeword including a plurality of bits;
   flip one or more of the plurality of bits in the codeword in each of a plurality of iterations of bit flipping decoding using a first set of one or more bit flipping rules, wherein each of the plurality of iterations includes a determination of a syndrome weight;
   determine a count of iterations in which the syndrome weight increased satisfies a syndrome weight increase count threshold; and
   in response to determining the count of iterations satisfies the syndrome weight increase count threshold, flip one or more of the plurality of bits in the codeword a subsequent iteration of bit flipping decoding using a second set of one or more bit flipping rules, wherein the second set of bit flipping rules differs from the first set of bit flipping rules.

9. The non-transitory computer-readable storage medium of claim 8, wherein the processing device is further to:
   add the syndrome weight to a list of syndrome weights.

10. The non-transitory computer-readable storage medium of claim 8, wherein the processing device is further to:
    determining the syndrome weight of a current iteration represents an increase in syndrome weight from a previous iteration; and
    adding an indication of the increase in syndrome weight to a syndrome slope memory.

11. The non-transitory computer-readable storage medium of claim 10, wherein the syndrome slope memory is a first-in, first-out (FIFO) list of indications of syndrome weight slope between subsequent iterations, and wherein determining the count of iterations in which the syndrome weight increased is limited to a window of iterations defined by a length of the FIFO list.

12. The non-transitory computer-readable storage medium of claim 8, wherein the processing device is further to:
    determining the syndrome weight of a current iteration represents a decrease in syndrome weight from a previous iteration; and
    adding an indication of the decrease in syndrome weight to a syndrome slope memory.

13. The non-transitory computer-readable storage medium of claim 8, wherein the second set of bit flipping rules differs from the first set of bit flipping rules in one or more of:
    use of channel information;
    an order the bit flipping decoder evaluates the plurality of bits of the codeword for flipping; and
    a bit flipping threshold, wherein the bit flipping threshold is compared against an energy function of each of the plurality of bits of the codeword in determining which bits to flip.

14. The non-transitory computer-readable storage medium of claim 8, wherein the first set of bit flipping rules allows a bit to be flipped in back-to-back iterations and the second set of bit flipping rules prevents a bit from being flipped in back-to-back iterations.

15. A system comprising:
    a memory device; and
    a processing device, operatively coupled with the memory device, to:
    receive a codeword from a memory device, the codeword including a plurality of bits;
    flip one or more of the plurality of bits in the codeword in each of a plurality of iterations of bit flipping decoding using a first set of one or more bit flipping rules, wherein each of the plurality of iterations includes a determination of a syndrome weight;

determine a count of iterations in which the syndrome weight increased satisfies a syndrome weight increase count threshold, wherein determining the count of iterations in which the syndrome weight increased is limited to a window of iterations that is less than all iterations of the plurality of iterations; and in response to determining the count of iterations satisfies the syndrome weight increase count threshold, flip one or more of the plurality of bits in the codeword a subsequent iteration of bit flipping decoding using a second set of one or more bit flipping rules, wherein the second set of bit flipping rules differs from the first set of bit flipping rules.

16. The system of claim 15, wherein the processing device is further to:
add the syndrome weight to a list of syndrome weights.

17. The system of claim 15, wherein the processing device is further to:
determining the syndrome weight of a current iteration represents an increase in syndrome weight from a previous iteration; and
adding an indication of the increase in syndrome weight to a syndrome slope memory.

18. The system of claim 17, wherein the syndrome slope memory is a first-in, first-out (FIFO) list of indications of syndrome weight slope between subsequent iterations, and wherein the window of iterations is defined by a length of the FIFO list.

19. The system of claim 15, wherein the processing device is further to:
determining the syndrome weight of a current iteration represents a decrease in syndrome weight from a previous iteration; and
adding an indication of the decrease in syndrome weight to a syndrome slope memory.

20. The system of claim 15, wherein the second set of bit flipping rules differs from the first set of bit flipping rules in one or more of:
use of channel information;
an order the bit flipping decoder evaluates the plurality of bits of the codeword for flipping;
a bit flipping threshold, wherein the bit flipping threshold is compared against an energy function of each of the plurality of bits of the codeword in determining which bits to flip; and
whether a bit is permitted to be flipped in back-to-back iterations.

* * * * *